United States Patent
Halbach et al.

(10) Patent No.: US 12,259,546 B2
(45) Date of Patent: Mar. 25, 2025

(54) MICROMIRROR ARRAYS

(71) Applicants: ASML NETHERLANDS B.V., Veldhoven (BE); IMEC v.z.w., Leuven (BE)

(72) Inventors: Alexandre Halbach, Leuven (BE); Nitesh Pandey, Eindhoven (NL); Sebastianus Adrianus Goorden, Eindhoven (NL); Veronique Rochus, Leuven (BE); Luc Roger Simonne Haspeslagh, Linden (BE); Guilherme Brondani Torri, Leuven (BE)

(73) Assignee: ASML NETHERLANDS B.V., Veldhoven (NL)

( * ) Notice: Subject to any disclaimer, the term of this patent is extended or adjusted under 35 U.S.C. 154(b) by 578 days.

(21) Appl. No.: 17/634,023

(22) PCT Filed: Aug. 5, 2020

(86) PCT No.: PCT/EP2020/072006
§ 371 (c)(1),
(2) Date: Feb. 9, 2022

(87) PCT Pub. No.: WO2021/032484
PCT Pub. Date: Feb. 25, 2021

(65) Prior Publication Data
US 2022/0342199 A1    Oct. 27, 2022

(30) Foreign Application Priority Data

Aug. 19, 2019  (EP) ..................................... 19192294
Sep. 26, 2019  (EP) ..................................... 19199722

(51) Int. Cl.
G02B 26/08    (2006.01)
B81B 3/00     (2006.01)
(Continued)

(52) U.S. Cl.
CPC .......... G02B 26/085 (2013.01); B81B 3/0021 (2013.01); B81B 7/0087 (2013.01);
(Continued)

(58) Field of Classification Search
None
See application file for complete search history.

(56) References Cited

U.S. PATENT DOCUMENTS 5,229,874 A    7/1993  Lehureau et al.
5,296,891 A    3/1994  Vogt et al.
(Continued)

FOREIGN PATENT DOCUMENTS

CN    1494665 A    5/2004
CN    1530319      9/2004
(Continued)

OTHER PUBLICATIONS

Office Action issued in corresponding Chinese Patent Application No. 202080058816.3, dated Feb. 27, 2024.
(Continued)

*Primary Examiner* — Euncha P Cherry
(74) *Attorney, Agent, or Firm* — Pillsbury Winthrop Shaw Pittman, LLP

(57) ABSTRACT

A micromirror array includes a substrate, a plurality of mirrors for reflecting incident radiation, and for each mirror of the plurality of mirrors, a respective post connecting the substrate to the respective mirror. The micromirror array further includes, for each mirror of the plurality of mirrors, one or more electrostatic actuators connected to the substrate for applying force to the respective post to displace the respective post relative to the substrate, thereby displacing the respective mirror. Also disclosed is a method of forming such a micromirror array. The micromirror array may be used in a programmable illuminator. The programmable
(Continued)

illuminator may be used in a lithographic apparatus and/or in an inspection apparatus.

23 Claims, 10 Drawing Sheets

(51) Int. Cl.
    *B81B 7/00*         (2006.01)
    *G03F 7/00*         (2006.01)

(52) U.S. Cl.
    CPC ........ *G03F 7/70116* (2013.01); *G03F 7/7015* (2013.01); *B81B 2201/042* (2013.01); *B81B 2203/0136* (2013.01); *B81B 2203/0163* (2013.01)

(56) References Cited

U.S. PATENT DOCUMENTS

| | | | |
|---|---|---|---|
| 5,523,193 | A | 6/1996 | Nelson |
| 8,294,877 | B2 | 10/2012 | Wangler et al. |
| 8,817,235 | B2 | 8/2014 | Tinnemans et al. |
| 9,946,167 | B2 | 4/2018 | Smilde et al. |
| 10,254,654 | B2 | 4/2019 | Palmer et al. |
| 2002/0131682 | A1 | 9/2002 | Nasiri et al. |
| 2006/0066964 | A1 | 3/2006 | Greywall |
| 2008/0037103 | A1 | 2/2008 | Papavasiliou et al. |
| 2009/0279066 | A1 | 11/2009 | Tinnemans et al. |
| 2014/0104687 | A1 | 4/2014 | Warashina et al. |
| 2018/0088347 | A1 | 3/2018 | Van Der Zouw et al. |
| 2018/0180872 | A1* | 6/2018 | Hopkins ................ G02B 7/182 |
| 2018/0246415 | A1 | 8/2018 | Xalter et al. |
| 2019/0039881 | A1 | 2/2019 | Starman et al. |

FOREIGN PATENT DOCUMENTS

| | | |
|---|---|---|
| CN | 1603225 | 4/2005 |
| CN | 1608223 | 4/2005 |
| CN | 1853129 | 10/2006 |
| CN | 1906119 | 1/2007 |
| CN | 101160257 | 4/2008 |
| CN | 101233441 | 7/2008 |
| CN | 103336363 | 10/2013 |
| CN | 107430267 | 12/2017 |
| CN | 108803249 | 11/2018 |
| DE | 102013206531 | 5/2014 |
| DE | 102013225790 | 6/2014 |
| DE | 102017214441 | 5/2018 |
| EP | 1058143 | 12/2000 |
| EP | 1591824 | 11/2005 |
| EP | 2902358 | 8/2015 |
| JP | 2009272624 | 11/2009 |
| JP | 2010518595 | 5/2010 |
| JP | 2019521381 | 7/2019 |
| WO | 98/33096 | 7/1998 |
| WO | 98/38597 | 9/1998 |

OTHER PUBLICATIONS

Office Action issued in corresponding Israeli Patent Application No. 289986, dated Dec. 24, 2023.
Office Action issued in corresponding Chinese Patent Application No. 202080058816.3, dated Jul. 15, 2024.
International Search Report and Written Opinion issued in corresponding PCT Patent Application No. PCT/EP2020/072006, dated Nov. 6, 2020.
Office Action issued in corresponding Japanese Patent Application No. 2022-506152, dated May 2, 2024.

* cited by examiner

MICROMIRROR ARRAYS

CROSS-REFERENCE TO RELATED APPLICATIONS

This application is the U.S. national phase entry of PCT Patent Application No. PCT/EP2020/072006 which was filed on Aug. 5, 2020, which claims the benefit of priority of European Patent Application No. 19192294.7 which was filed on Aug. 19, 2019 and of European Patent Application No. 19199722.0 which was filed on Sep. 26, 2019 which are incorporated herein in their entireties its entirety by reference.

FIELD

The present invention relates to a micromirror array, a programmable illuminator comprising such a micromirror array, a lithographic apparatus comprising such a programmable illuminator, an inspection apparatus comprising such a programmable illuminator and a method for forming such a micromirror array.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device onto a layer of radiation-sensitive material (resist) provided on a substrate. The term "patterning device" as employed in this text should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device. Examples of such patterning devices include:

A mask (or reticle). The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask may be supported by a support structure such as a mask table or mask clamp. This support structure ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis, for example by applying a suitable localized electric field, or by employing electrostatic or piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. Such a programmable mirror array may be supported by a support structure such as a frame or table, for example, which may be fixed or movable as required; and A programmable LCD array. An example of such a construction is given in U.S. Pat. No. 5,229,872, which is incorporated herein by reference. Such a programmable LCD array may be supported by a support structure such as a frame or table, for example, which may be fixed or movable as required.

For purposes of simplicity, the rest of this text may, at certain locations, specifically direct itself to examples involving a mask and a mask table; however, the general principles discussed in such instances should be seen in the broader context of the patterning means as hereabove set forth.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Besides the wavelength (k) of the radiation and the Numerical Aperture (NA) of the projection lens, the shape, or more generally the angular intensity distribution, of the illumination source is one of the most important parameters in enabling high resolution in lithography.

A micromirror array, comprising an array of hundreds or thousands of micromirrors (often referred to below simply as "mirrors"), can be used in the illumination system of a lithographic apparatus to control the cross-sectional shape and intensity distribution of the light. Each micromirror reflects a spot of light and changing the angles of the micromirrors changes the positions of the spots and thus changes the shape of the radiation beam.

Microelectromechanical systems (MEMS) technology may be used to manufacture and control the mirrors. For example, an electrostatic or piezoelectric MEMS system may be used to angle the mirrors.

Currently micromirror arrays exist for shaping light having a wavelength in the deep ultraviolet spectrum (DUV), e.g. $\lambda=193$ nm. However, these micromirror arrays cannot be effectively used at shorter wavelengths as required for light in the extreme ultraviolet spectrum (EUV), e.g. $\lambda=13.5$ nm. New micromirror array technology is required for use with EUV radiation. Also, advantageous new applications for this new micromirror array technology are desired, for use with EUV and/or non-EUV radiation, e.g. visible light or DUV radiation.

SUMMARY

According to a first aspect of the present invention there is provided a micromirror array, which for example may be used in the illumination system of a lithographic apparatus or an inspection apparatus to condition a radiation beam. The micromirror array comprises a substrate and a plurality of mirrors for reflecting incident light. For each mirror of the plurality of mirrors, there are a respective post for supporting the mirror, and one or more electrostatic actuators connected to the substrate for applying force to the post to displace the post relative to the substrate and thereby displace the mirror. The mirror may be supported from the substrate by the post, but the post is displaceable relative to the substrate. The electrostatic actuators can act directly on the post, rather than the mirror, to tip and tilt the mirror as required.

In one case, the electrostatic actuators may be arranged to apply force to the pillar in corresponding directions which are substantially in the plane of the substrate, i.e. "laterally". This may be in the plane of the front surface of the mirror in a rest configuration.

The electrostatic actuators may comprise at least a pair of comb actuators, or preferably two pairs of comb actuators, wherein each comb actuator comprises a static part fixed to the substrate and a moving part which is movable relative to the substrate and connected to the post, and at least one "comb" of elongate conductive elements extend from the static part and are interleaved with a comb of elongate conductive elements which are part of the moving part. By applying a voltage to a comb actuator the moving part pulls on the post, causing it deflect and thereby displace the mirror. Having two pairs of comb actuators arranged around the post allows tip and tilt (2D) displacement control of the mirror. The moving part of each comb actuator may be shaped as a trapezium, and may be anchored to the substrate at some or all corners of the trapezium. Anchors at the corners of the trapezium can provide flexibility to the comb actuator. Having four comb actuators, each with a trapezium shape, allows the surface area covered by the electrostatic actuators to be maximized for a given footprint. Each electrostatic actuator can be connected to the post by one or more spring elements (resilient elements, e.g. with an elongate form), which can transmit the force from the actuator to the post and improve deflection of the post for a given force. A spring element may be a thin (e.g. 1 μm thick) strip of silicon, which allows forces from the electrostatic actuator to be transferred to the post.

The micromirror array may comprise, for each mirror in the array, a sensing element for sensing displacement of the mirror. The sensing element can be used in a displacement control feedback system to adjust the voltage provided to the electrostatic actuators in order to achieve a target mirror angle. The sensing element may comprise a protrusion from the mirror and an electrode connected to the substrate and arranged to sense a capacitance between the protrusion and the electrode. The capacitance is a function of the distance between the protrusion and the electrode and can therefore be used to derive the displacement of the mirror. Alternatively or additionally, the sensing element may comprise a piezoresistor coupled to the post. For example, a piezoresistor can be located on one or more of the flexible connections between the post and the heat sink. As the post is deflected, the piezoresistor becomes stressed thereby measurably changing its electrical properties. Optionally, a temperature sensor may be provided to measure the temperature of the piezoresistor, and the sensing element is operative to use the temperature value output by the sensor to compensate for variation due to temperature of the relationship between the resistance and deflection of the piezoresistor.

The micromirror array may comprise, for each mirror in the array, a heat diffuser for diffusing heat from the mirror. Overheating of the mirror can impede displacement control of the mirror and/or damage underlying MEMS components. This can be a particular problem for EUV applications, since the short wavelength of incident light results in greater absorbed thermal power per mirror. The heat diffuser can solve this problem by dissipating heat from the mirror. The heat diffuser may comprise a heat sink connected to the substrate and a plurality of flexible connectors connecting the heat sink to the post. Typically, the micro-mirror array is intended to operate in environment with a gas pressure far less than one atmosphere, in fact typically substantially in a vacuum, so heat convection is substantially zero. Instead, the heat diffuser allows heat to be conducted away, such as to the substrate. Note that there is a trade-off between increased flexibility of the flexible connectors, and increased ability for the heat diffuser to conduct heat away from the mirror. Applying the actuation force to the pillar laterally, and in particular by comb actuators, allows increased force to be applied to the flexible connectors compared to conventional mirror arrays, in turn allowing the flexible connectors to be selected to provide improved thermal conductivity. This allows the present micromirror array to be used in applications for which the conventional mirror arrays would be unsuitable.

Each mirror in the array is preferably suitable for reflecting light having a wavelength of about 13 nm, such as a range centered at substantially 13.5 nm, so that the micromirror array can be used for EUV applications.

According to a second aspect of the present invention there is provided a programmable illuminator that comprises a micromirror array according to the first aspect of the present invention for conditioning a radiation beam.

The programmable illuminator may further comprise a displacement control feedback system configured to determine for each mirror in the micromirror array a position of the mirror and to adjust a voltage applied to the associated electrostatic actuators based on the determined position and based on a predefined target position of the mirror.

According to a third aspect of the present invention there is provided a lithographic apparatus arranged to project a pattern from a patterning device onto a substrate. The lithographic apparatus comprises a programmable illuminator according to the second aspect of the present invention for conditioning a radiation beam used to illuminate the patterning device and/or for conditioning a radiation beam used to measure a target structure on the substrate. The micromirror array in the programmable illuminator may be used in an illumination system of a lithographic apparatus for example to control or condition a cross-sectional shape and/or intensity distribution of the light or radiation beam that is used to illuminate the patterning device. Alternatively or in addition, the micromirror array in the programmable illuminator may be used in an alignment system and/or overlay measurement system, respectively, of the lithographic apparatus to control or condition a spectral and/or spatial distribution of the light or radiation beam that is used to measure a position of an alignment mark(er) or target structure on the substrate and/or to perform an overlay measurement of a mark(er) or target structure on the substrate, respectively.

According to a fourth aspect of the present invention there is provided an inspection apparatus that comprises a programmable illuminator according to the second aspect of the present invention for conditioning a radiation beam used to measure a target structure on a substrate. For example, the micromirror array in the programmable illuminator may be used to control or condition a spectral and/or spatial distribution of the light or radiation beam that is used by the inspection apparatus to measure a target structure, e.g. a mark(er), on the substrate in order to determine the position of that target structure for alignment purposes and/or in order to perform an overlay measurement.

According to a fifth aspect of the present invention there is provided a method of forming a micromirror array. The method may be used to form a micromirror array according to the first aspect of the present invention. The method of forming a micromirror array comprises providing a substrate, forming a plurality of mirrors for reflecting incident light and, for each mirror in the array, a respective post supporting the mirror. The method further comprises, for each mirror in the array, forming one or more electrostatic actuators connected to the substrate for applying force to the post to displace the post relative to the substrate to thereby displace the mirror.

The step of forming the one or more electrostatic actuators may comprise forming at least a pair of comb actuators, and preferably forming two pairs of comb actuators arranged to enable tip and tilt displacement control of the mirror, wherein each comb actuator comprises a static part fixed to the substrate and an moving part which is movable relative to the substrate and connected to the post. Each comb actuator can be shaped as a trapezium and anchored to the substrate at some or all corners of the trapezium. The step of forming the one or more electrostatic actuators can comprise forming one or more spring elements connecting the one or more electrostatic actuators to the post.

The method may comprise, for each mirror of the plurality of mirrors, forming a sensing element for sensing a displacement of the mirror. The step of forming the sensing element may comprise forming a protrusion from the mirror and an electrode connected to the substrate and arranged to sense a capacitance between the protrusion and the electrode. Alternatively, the step of forming the sensing element may comprise forming a piezoresistor coupled to the post.

The method may comprise, for each mirror in the array, forming a heat diffuser for diffusing heat from the mirror. The step of forming the heat diffuser may comprise forming a heat sink and a plurality of flexible connectors connecting the heat sink to the post.

BRIEF DESCRIPTION OF THE DRAWINGS

Embodiments of the invention will now be described, by way of example only, with reference to the accompanying schematic drawings, in which:

FIG. 1b depicts a programmable illuminator for use in the inspection apparatus of FIG. 1a.

DETAILED DESCRIPTION

Figure 1:
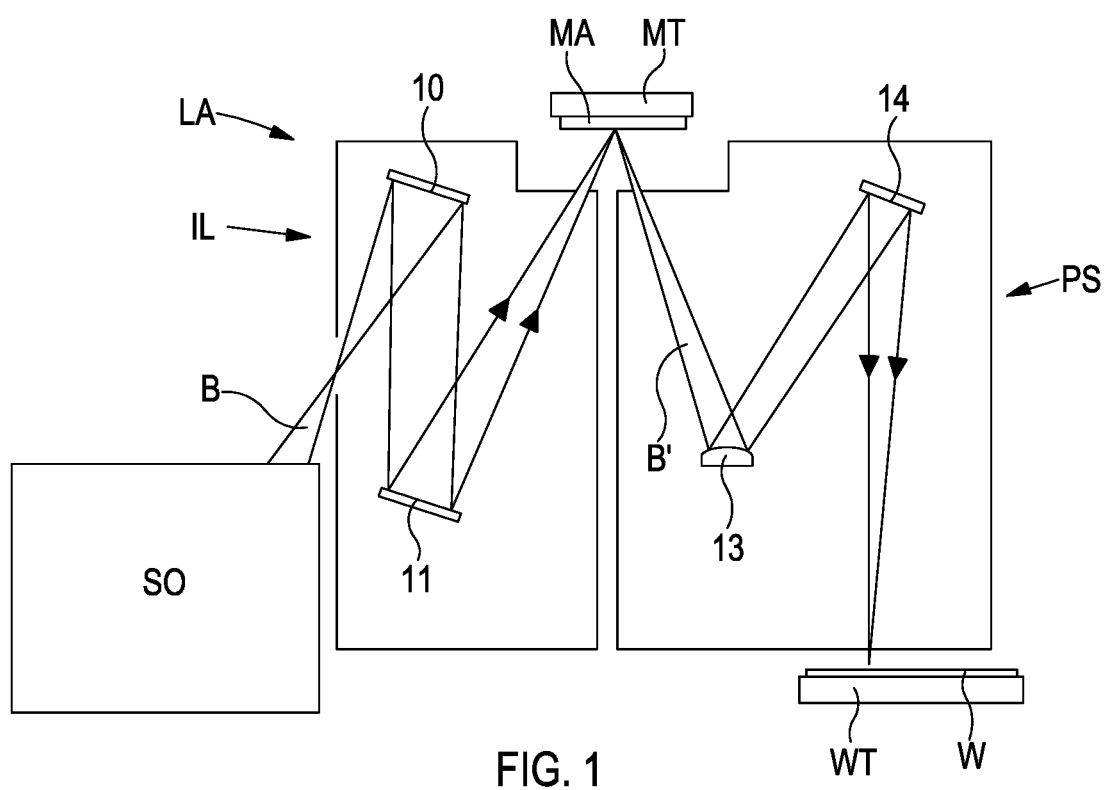
FIG. 1 depicts a lithographic system comprising a lithographic apparatus with a (programmable) illuminator and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure or mask table MT configured to support a patterning device MA, a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The illumination system IL may include other mirrors or devices in addition to, or instead of, the faceted field mirror device 10 and/or the faceted pupil mirror device 11. For example, a micromirror array as described herein may be added to the illumination system IL in addition to the facetted field mirror device 10 and faceted pupil mirror device 11 as disclosed in U.S. Pat. No. 8,294,877 B2, which is hereby incorporated in its entirety by reference, or may be used to replace one or both of the faceted field mirror device 10 and the faceted pupil mirror device 11 as disclosed in U.S. Pat. No. 10,254,654 B2, which is hereby incorporated in its entirety by reference. In that case the illumination system IL, which now includes at least one micromirror array as described herein, is a programmable illuminator IL. Such a programmable illuminator IL may be used for conditioning a radiation beam used to illuminate the patterning device. For example, the programmable illuminator IL may be used to control or condition the EUV radiation beam B by providing it with a desired cross-sectional shape and/or a desired intensity distribution.

After being thus conditioned, the EUV radiation beam B illuminates the patterning device MA and interacts with it. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 1A:
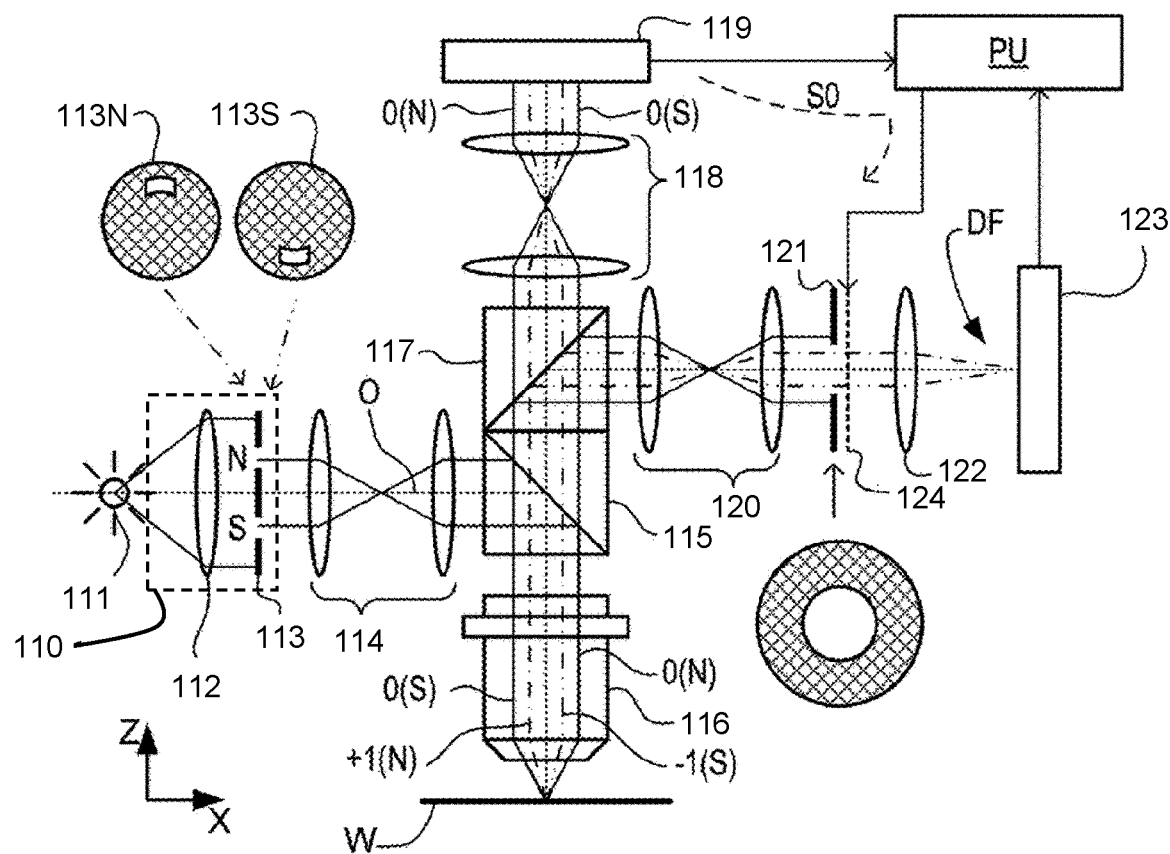
FIG. 1a depicts a known inspection apparatus.

FIG. 1a shows an inspection apparatus that is known from U.S. Pat. No. 9,946,167 B2, which is hereby incorporated in its entirety by reference. FIG. 1a corresponds to FIG. 3a of U.S. Pat. No. 9,946,167 B2. The inspection apparatus is a dark field metrology apparatus for measuring e.g. overlay and/or alignment.

In lithographic processes, it is desirable to frequently make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device and alignment, i.e. the position of alignment marks on the substrate. Various forms of scatterometers have been developed for use in the lithographic field. These devices direct a beam of radiation onto a target structure, e.g. a grating or mark(er), and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The dark field metrology apparatus shown in FIG. 1a may be a stand-alone device/system or may be incorporated in the lithographic apparatus LA as an alignment system and/or as an overlay measurement system (not shown). An optical axis, which has several branches throughout the apparatus, is represented by a dotted line O. In this apparatus, light emitted by radiation source 111 (e.g., a xenon lamp) is directed onto a substrate W via a beam splitter 115 by an optical system comprising lenses 112, 114 and objective lens 116. These lenses are arranged in a double sequence of a 4F arrangement. Therefore, the angular distribution at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 113 of suitable form between lenses 112 and 114, in a plane which is a back-projected image of the objective lens pupil plane. In the example illustrated, aperture plate 113 has different forms, labeled 113N and 113S, allowing different illumination modes to be selected. The illumination system in the present example forms an off-axis illumination mode. In the first illumination mode, aperture plate 113N provides off-axis from a direction designated, for the sake of description only, as 'north'. In a second illumination mode, aperture plate 113S is used to provide similar illumination, but from an opposite direction, labeled 'south'. Other modes of illumination are possible by using different apertures. The rest of the pupil plane is desirably dark, as any unnecessary light outside the desired illumination mode will interfere with the desired measurement signals.

A target structure (not shown), e.g. a grating or mark(er), on substrate W is placed normal to the optical axis O of objective lens 116. A ray of illumination impinging on the target structure from an angle off the axis O gives rise to a zeroth diffraction order ray and two first diffraction order rays. Since the aperture in plate 113 has a finite width (necessary to admit a useful quantity of light) the incident rays will in fact occupy a range of angles, and the diffracted rays 0 and +1/−1 will be spread out somewhat. According to the point spread function of a small target, each order +1 and −1 will be further spread over a range of angles, not a single ideal ray. Note that the grating pitches and illumination angles can be designed or adjusted so that the first order rays entering the objective lens are closely aligned with the central optical axis.

At least the 0 and +1 orders diffracted by the target on substrate W are collected by objective lens 116 and directed back through beam splitter 115. Both the first and second illumination modes are illustrated, by designating diametrically opposite apertures labeled as north (N) and south (S). When the incident ray is from the north side of the optical axis, that is when the first illumination mode is applied using aperture plate 113N, the +1 diffracted rays, which are labeled +1(N), enter the objective lens 116. In contrast, when the second illumination mode is applied using aperture plate 113S the −1 diffracted rays (labeled −1(S) are the ones which enter the lens 116.

A second beam splitter 117 divides the diffracted beams into two measurement branches. In a first measurement branch, optical system 118 forms a diffraction spectrum (pupil plane image) of the target on first sensor 119 (e.g. a CCD or CMOS sensor) using the zeroth and first order diffractive beams. Each diffraction order hits a different point on the sensor, so that image processing can compare and contrast orders. The pupil plane image captured by sensor 119 can be used for focusing the inspection apparatus and/or normalizing intensity measurements of the first order beam. The pupil plane image can also be used for many measurement purposes such as reconstruction.

In the second measurement branch, an optical system including lenses 120, 122 forms an image of the target on the substrate W on sensor 123 (e.g. a CCD or CMOS sensor). In the second measurement branch, an aperture plate referred to as field stop 121 is provided in a plane that is conjugate to the pupil-plane. This plane will be referred to as an 'intermediate pupil plane' when describing the invention. Field stop 121 functions to block the zeroth order diffracted beam so that the image of the target formed on sensor 123 is formed only from the −1 or +1 first order beam. The images captured by sensors 119 and 123 are output to image processor and controller PU, the function of which will depend on the particular type of measurements being performed. Note that the term 'image' is used here in a broad sense. An image of the grating lines as such will not be formed, if only one of the −1 and +1 orders is present.

The illumination system of the inspection apparatus comprises an illuminator 110. As shown in FIG. 1a, this illuminator 110 comprises lens 112 and aperture plate 113. More details of the inspection apparatus can be found in U.S. Pat. No. 9,946,167 B2.

Figure 1B:
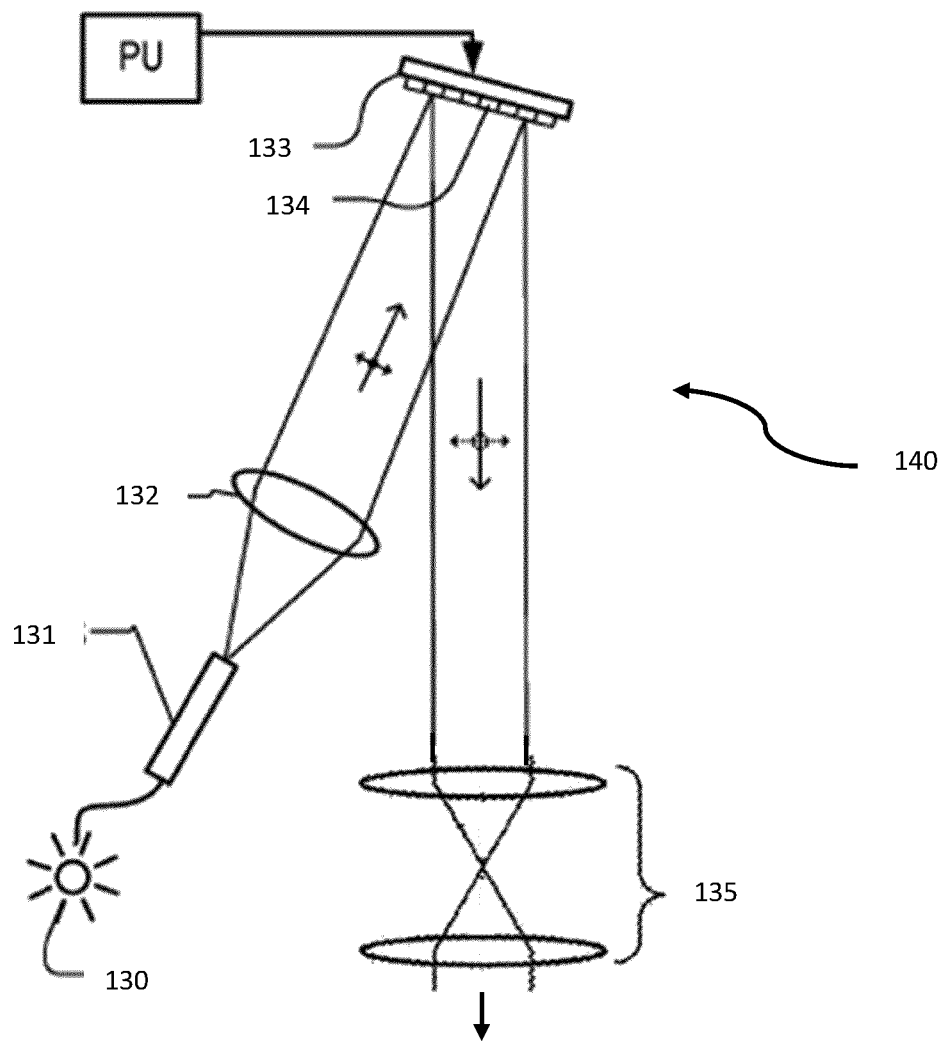

FIG. 1b shows a programmable illuminator 140 for use in the inspection apparatus of FIG. 1a. This programmable illuminator 140 can be used in the inspection apparatus of FIG. 1a instead of the illuminator 110. The programmable illuminator 140 comprises a micromirror array 133 according to the present invention as well as a low NA relay 4F system 135 comprising a pair of lenses. Radiation or light from a radiation source 130 (not part of the programmable illuminator 140), e.g. a broad band radiation source or white light source, may be directed via an optional fiber 131 and an optional collimating lens system 132 to the micromirror array 133. A processing unit PU can control the micromirror array 133 in such a way that the micromirrors 134, or more precise the mirrors in the micromirrors 134, in the micromirror array 133 are tilted individually. By tuning the tilt angle of each individual mirror independently, the spatial distribution of the light that is output by the low NA relay system 135 can be controlled and various illumination modes can be made as desired without having to use aperture plates. If the programmable illuminator 140 is used in the inspection apparatus of FIG. 1a it interfaces with lenses 114, meaning that the light that is output by the low NA relay system 135 is received by the lenses 114 of FIG. 1a.

In order to control the spectral distribution of the light that is output by the low NA relay system 135 at least part of the mirrors may comprise a grating on top of the mirror surfaces (not shown). The grating may be the same for all mirrors or, alternatively, different gratings, e.g. gratings having different pitches, may be used. By appropriate control of the micromirror array 133 the light that is output by the low NA relay system 135 comprises a single wavelength or a single (narrow) range of wavelengths. It is however also possible to control the micromirror array 133 in such a way that the light that is output by the low NA relay system 135 comprises a number of different wavelengths or a number of different (narrow) ranges of wavelengths. The gratings may be lithographically patterned on the mirror surfaces. Each mirror with grating diffracts light of different wavelengths in different directions according to the associated grating equation. A portion of the diffracted light is captured by the low NA relay system 135 and an image is formed. By tuning the angle of each mirror independently, the light distribution at the output can be controlled both spatially and spectrally as (a) certain diffraction order(s) will be captured by the low NA relay system 135 and (an)other diffraction order(s) will not be captured. Such a spatial and spectral light distribution can be used advantageously for example for illuminating and measuring an overlay target structure on a substrate or for measuring the position of an alignment mark on a substrate. In this text, the terms target structure, target, mark, marker and grating are, where the context allows, all synonyms of each other.

The spectral bandwidth of the diffracting beam which can be captured by the low NA relay system 135 is $d\lambda=P \cdot NA$ where P is the pitch of the grating and NA is the numerical aperture of the low NA relay system 135. With P=500 nm and NA=0.02 the spectral bandwidth is 10 nm, meaning that a diffraction order of the grating comprises a range or band of wavelengths of 10 nm.

The spatial resolution of the low NA relay system 135 is $\sim\lambda/NA$. With $\lambda$=850 nm and NA=0.02 the spatial resolution is 42.5 micrometer. If the size of the mirrors Is greater than 42.5 micrometer, each mirror can be resolved. A reasonable size of a mirror is 100×100 micrometer.

By rotating/tilting the mirrors around their individual axis, a different central wavelength band can be directed into the low NA relay system 135. The rotating range of each mirror required for operation over the visible wavelength range should be $\Delta V/2P$, where $\Delta\lambda$=400 nm for an operating wavelength range of 450 nm-850 nm. This means that each mirror must be able to rotate by 0.4 radians.

Figure 2:
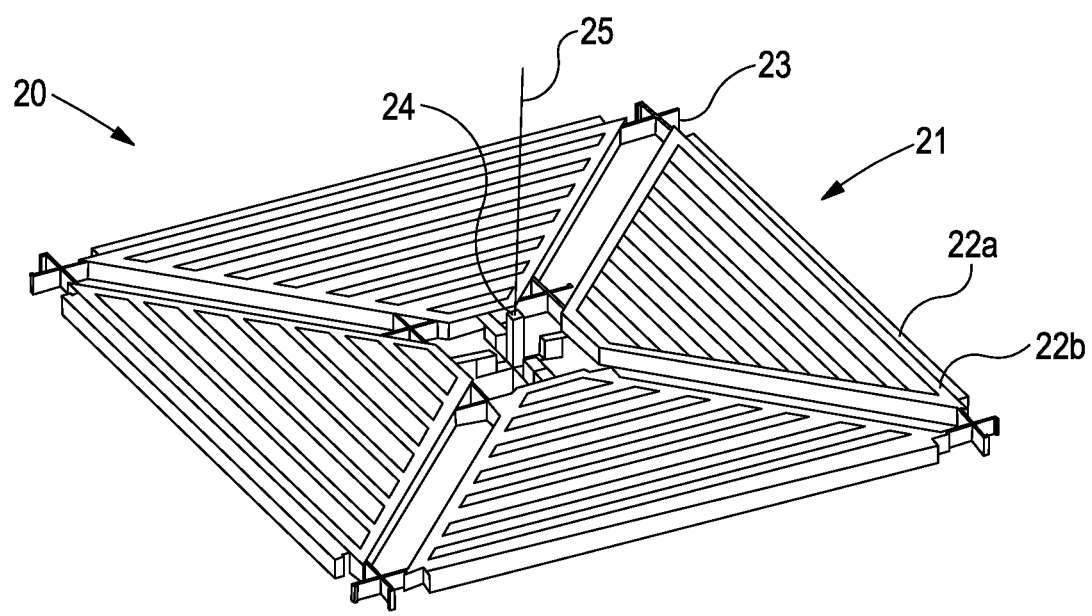
FIG. 2 depicts a part of a micromirror array comprising two pairs of comb actuators.

The MEMS system in FIG. 2 is a micromirror with a mirror (not shown) and four electrostatic actuators 21 for displacing the mirror. In other embodiments (not shown) the micromirror may have a different number of electrostatic actuators 21 for displacing the mirror. In all these embodiments the micromirror has one or more electrostatic actuators 21 for displacing the mirror. A number of micromirrors as shown in FIG. 2 can be arranged in an array to form a micromirror array.

FIG. 2 shows a schematic diagram of a part of a micromirror array 20 for displacing a mirror (not shown) in the array. The part of the array 20 comprises electrostatic actuators 21 being two pairs of comb actuators. Each of the four comb actuators 21 comprises a fixed part 22a fixed to the substrate and a moving part 22b movable relative to the substrate. The movable part 22b is shaped as a trapezium and is flexibly anchored to the substrate at each corner of the trapezium by anchors 23. The anchors 23 provides a flexible connection between the substrate and the movable part 22b of the comb actuator 21. The movable part 22b of each comb actuator is connected to a post 24, which supports the mirror. By applying a voltage to the comb actuators 21, the movable part 22b of the actuators 21 moves relative to the substrate and exerts a force on the post 24, which deflects and thereby displaces the mirror. The magnitude of the displacement is a function of the applied voltage. By selectively applying a voltage to the pairs of comb actuators, the mirror can be tipped and/or tilted. The micromirror array 20 has four-fold rotational symmetry about the axis 25.

Figure 3:
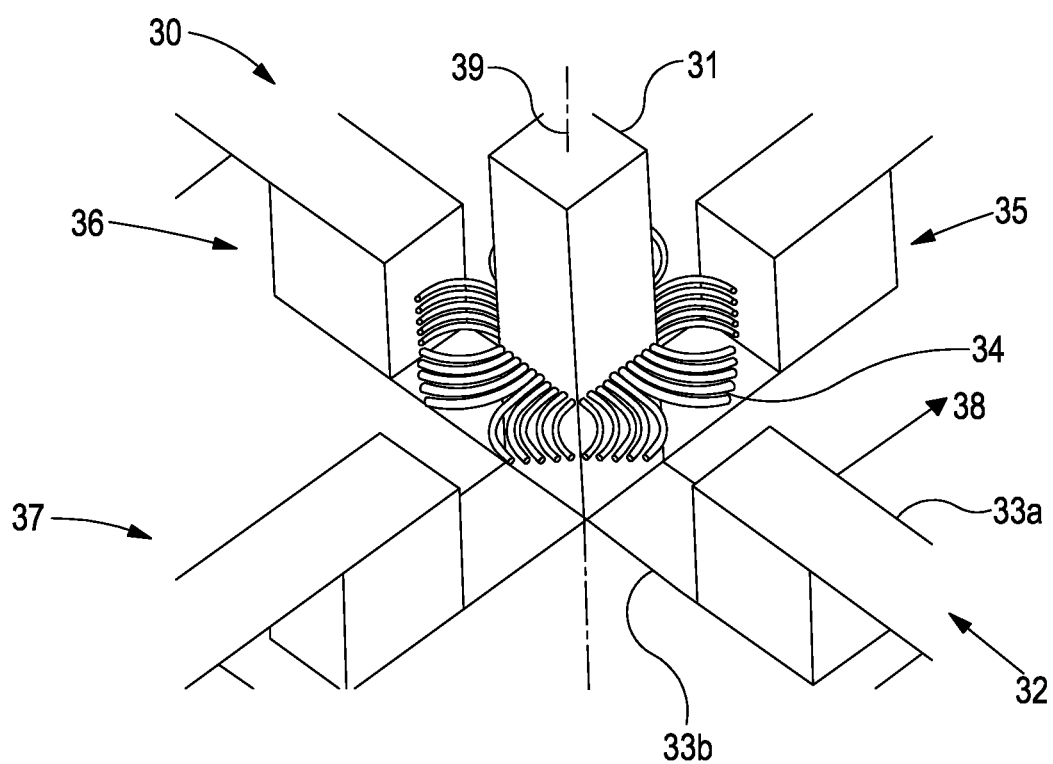
FIG. 3 depicts a post and spring elements for displacing a mirror in a micromirror array.

FIG. 3 shows a schematic diagram of a part of a micromirror array 30 for displacing a mirror (not shown) in the array. The micromirror array 30 may be the micromirror array 20 of FIG. 2. The micromirror array 30 has four-fold rotational symmetry about the axis 39. The part of the array 30 comprises a post 31 for supporting the mirror connected to four pairs of spring elements 32, 35, 36, 37. The post 31 typically connects to the center of the back of the mirror (i.e. a portion of the mirror opposite to the reflective surface). Referring for example to the pair of spring elements 32, it comprises an upper spring element 33a and a lower spring element 33b. Here the terms "upper" and "lower" refer different distances above a plane of the substrate. The spring elements 33a, 33b are strips of flexible material, typically strips of silicon. The upper spring element 33a of each pair of spring elements 32 is connected to an electrostatic actuator (not shown) such as a comb actuator. The spring elements 33a, 33b can transmit forces from the electrostatic actuators to the post 31 in order to deflect and/or translate the post 31 relative to the substrate, and thereby displace the mirror relative to the substrate. Flexible connectors 34 are thin silicon strands extending from the post 31 in a directly parallel to the plane of the substrate, and are mounted on the post 31 for transferring heat from the mirror to a heat sink (not shown), while not significantly impeding motion of the post 31. The flexible connectors 34 may be formed in the same silicon layer as the upper spring elements 33a.

Suppose that the electrostatic actuators corresponding to the pairs of spring elements 35, 37 act to translate the lower end of the post 39 in the direction indicated by the arrow 38, which is transverse to the axis 39. This causes the other pair of spring elements 32, 36 to be deformed. That is, the bottom spring element of each of the pairs of spring elements 32, 36 is displaced in the direction 38 relative to the top spring element of the pair of spring elements, and this tends to rotate the bottom spring element about its elongation direction relative to the substrate. This rotates the post 31 about that elongation direction. Thus, the post 31, and hence the mirror it supports, is tilted relative to the top surface of the substrate.

Figure 4A:
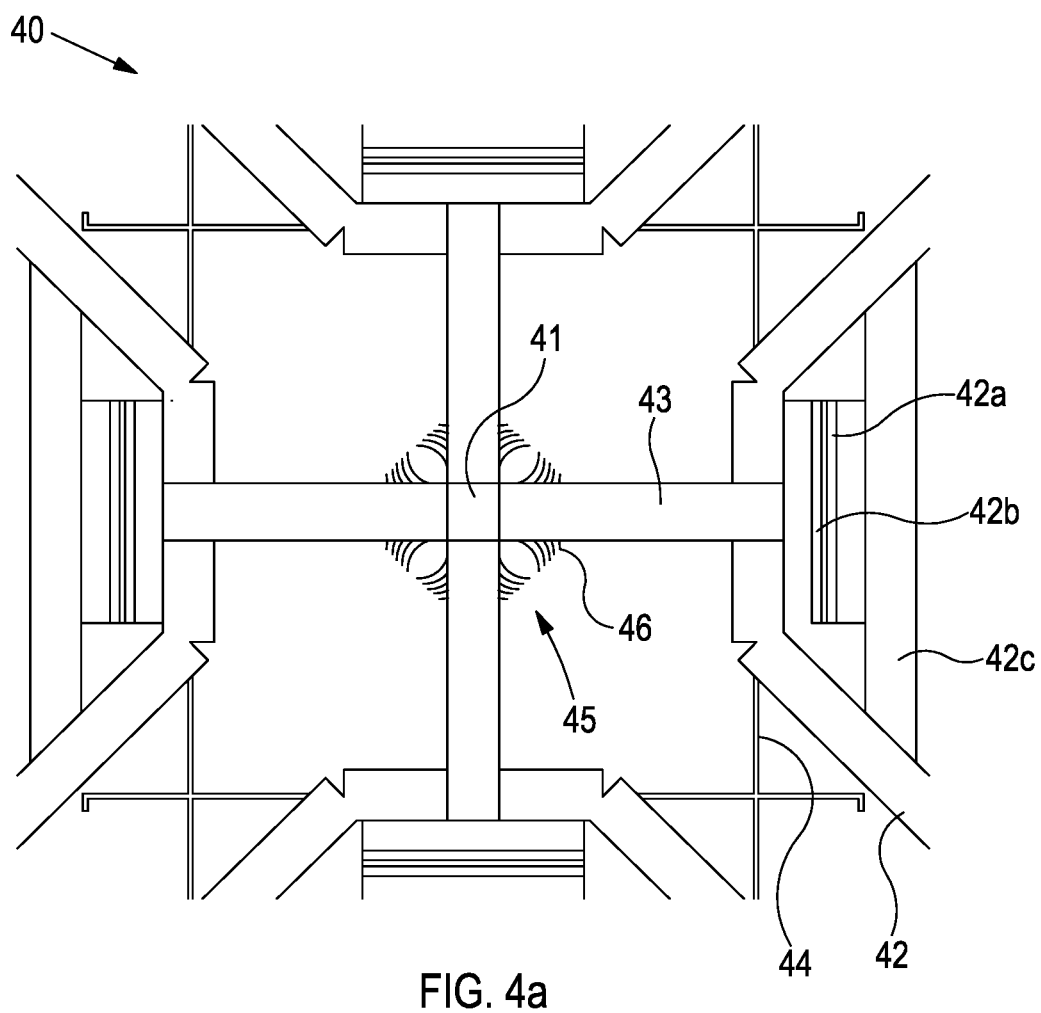
FIG. 4a depicts a top view of a part of a micromirror array.

FIG. 4a shows a schematic diagram of a top view of a part of a micromirror array 40 (which may be one of the micromirror arrays 20, 30). The part of the array 40 comprises a post 41 for supporting a mirror (not shown) and two pairs of comb actuators 42 connected to the post 41 via spring elements 43. Each comb actuator 42 may comprise a part shaped as a trapezium and flexibly anchored to the substrate at some or all corners of the trapezium by anchors 44. The part of the array 40 shown in FIG. 4a also comprises a heat diffuser 45 comprising a heat sink (not shown) and flexible connectors 46 connecting the post 41 to the heat sink.

FIG. 4a also illustrates in more detail the construction of each of the comb actuators 42. As in known comb actuator designs, the fixed part of each comb actuator comprises two parallel conductive portions 42a, 42b surrounded by a portion of the moving part 43c of the comb actuator 42. From each of the conductive portions 42a, 42b extend, in a respective opposite directions towards the moving part 42c of the comb actuator, a plurality of conductive elements ("fixed teeth"). The fixed teeth of each of the conductive portions 42a, 42b are interleaved with a corresponding plurality of "moving teeth" of approximately the same length mounted on the moving part 42c of the comb actuator, and extending towards the corresponding conductive portion 42a, 42b. Forces are developed between the moving teeth and the corresponding fixed teeth according to the differing voltages of the conductive portions 42a, 42b and the moving part 42c. Typically, these forces are relatively constant for a range of movement of the moving part 42c relative to the conductive portions 42a, 42b which is approximately the length of the teeth.

When, for example, the conductive portion 42b and the moving part 42c of each comb actuator are placed at zero volts, and the conductive portion 42a is set at a non-zero voltage (e.g. positive 100 volts), an attractive force is generated between the fixed teeth of conductive portion 42a and the moving teeth of the moving part 42c of the comb actuator. This draws the moving part 42c to the left in FIG. 4a, by a distance approximately equal to the length of the teeth. Conversely, if the conductive portion 42a and the moving part 42c are both grounded, and a non-zero voltage is applied to the conductive portion 42b, the moving part 42c of the comb actuator is urged to the right.

Figure 4B:
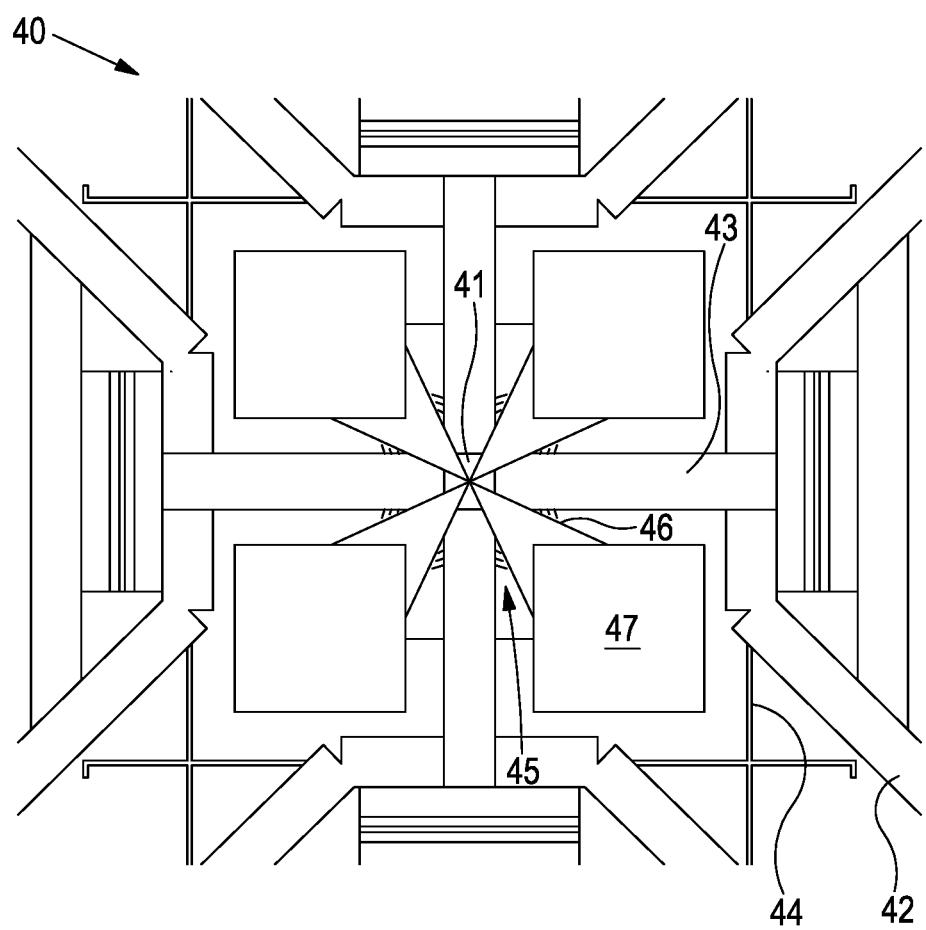
FIG. 4b depicts a top view of a part of another micromirror array having protrusions being a part of a sensing element.

FIG. 4b shows a similar part of the micromirror array, but including four protrusions 47 from the mirror and connected to the post 41. The protrusions 47 are part of a sensing element for sensing displacement of the mirror. The sensing element further comprises an electrode (not shown) underneath each protrusion 47, which is arranged to sense a capacitance between the protrusion 47 and that electrode. The sensing element may be a part of a displacement control feedback system, in which the measured capacitance is used to determine a mirror position. The feedback system may then adjust the voltage applied to the comb actuators 42 based on the determined mirror position and based on a target mirror position. The protrusions may also have the additional advantage of providing a larger bonding area between the mirror and the post 41.

Figure 5:
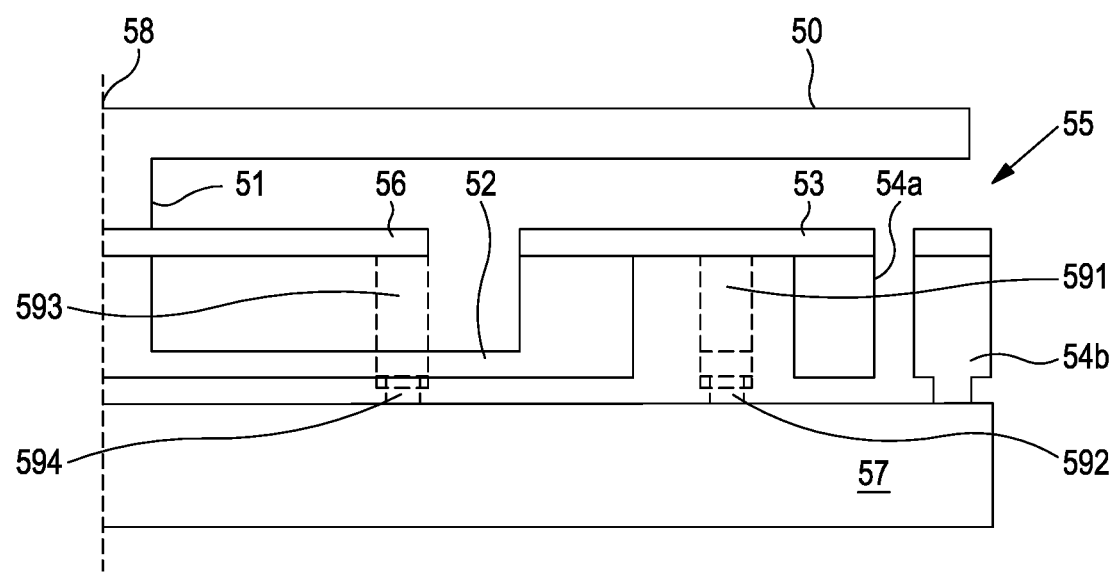
FIG. 5 depicts a cross section of a mirror and underlying MEMS system of a micromirror array.

FIG. 5 shows a cross sectional diagram of a part of a mirror 50 in a micromirror array which may be the micromirror array 20, 30 and/or 40 described above. The mirror 50 is typically rectangular (which in this document is used to include square) with each side being in the range 0.5 mm to 2.5 mm. For example, it may be a square having a surface area of 1 mm² and a through thickness of 100 µm. The mirror 50 is connected to one end of a post 51, which supports the mirror. The post 51 may be a cuboid having 20 µm×20 µm end surfaces and a 150 µm through thickness (i.e. height). The lower end of the post 51 is connected to a first end of a first spring element 52 (bottom spring element). The opposite end of the first spring element 52 is connected (via a vertically extending post) to the first end of a second spring element 53 (top spring element). A second end of the second spring element 53 is connected to the moving part 54a of a comb actuator 55. One corner of the moving part 54a of the comb actuator is connected to the substrate 57 by a post 591 which is mounted on the substrate 57 by a connection 592 (note that the post 591 and the connection 592 are at a different distance in the direction into the diagram from the first spring element 52 and the second spring element 53; that is, the plane containing the post 51, the first spring element 52 and the second spring element 53 does not contain the post 591 or the connection 592). Thus, the mirror 50 is supported by the post 51 which in turn is supported by the first spring element 52, which in turn is supported by the second spring element 53, which in turn is supported by the moving part 54a of the comb actuator, which in turn is supported by the substrate 57 using the post 591 and the connection 592.

The connection between the moving part 54a and the substrate 57 provided by the post 591 and the connection 592 is resilient, and flexes as the moving part 54a of the comb actuator moves laterally (i.e. in the left-right direction in FIG. 5) relative to the substrate 57.

Thus the post 51 is supported from the substrate 57 by a plurality of members, including multiple resilient members, which permit the post 51 to move relative to the substrate 57. Specifically, the post 51 is laterally translatable relative to the substrate 57, and additionally the post 51 is deflectable relative to the substrate 57, thus changing the relative orientation of the surface of the mirror and the top surface of the substrate 57.

By applying a voltage to the comb actuator 55, the moving part 54a can be pulled towards the fixed part 54b of the comb actuator 55. The two spring elements 52 and 53 couple the post 51 to the comb actuator 55 so as to transfer forces from the comb actuator to the post 51 in order to displace the mirror 50. The first spring element 52 may be a 1 µm thick strip of polysilicon and the second spring element 53 may a 1 µm thick strip of single crystalline silicon. The combs of the comb actuator 55 may be 30 µm thick polysilicon.

A flexible connector 56, being a part of a heat diffuser, is connected between the post 51 and the substrate 57. The flexible connector 56 is connected to the substrate 57 by a post 593 and connection 594, which do not lie in the plane containing the post 51, the first spring element 52 and the spring element 53. One or more (and typically all) of flexible connector 56, the post 593 and connection 594 are arranged to flex as the post 51 moves relative to the substrate 57.

The flexible connector 56 of the heat diffuser and the second spring element 53 may be formed in the same silicon layer. The heat diffuser may also be arranged to electrically connect the post 51 to the substrate 57. Only a half of the cross section of the mirror 50 and the underlying MEMS components is shown in FIG. 5, with the dashed line 58 indicating mirror symmetry.

Embodiments of the micromirror array can provide tip and tilt displacement range of +/−120 mrad and a mirror accuracy of 100 prad. Embodiments of the micromirror array can be operated at high light intensities as required for EUV, and may work at 40 to 60 kW/m2 of absorbed thermal power density (which implies an incident light power density on the surface of the mirror which is even larger). This is orders of magnitude higher than the absorbed thermal power density of micromirror arrays used in some other applications. This is possible because the comb actuators 21 are operative to provide, even at a relatively low actuator voltage (e.g. under about 100 volts), such a strong force that they are able to deform the flexible connector 56 even though the flexible connector 56 is thick enough to provide high heat conductivity to the substrate. Due to the high thermal conductivity, the micromirror array may in use have a temperature of under about 100 degrees Celsius.

The distance by which the outer edge of the mirror can move may be in the range 50 µm-120 µm, such as about 80 µm. Typically, known micromirror arrays permit a smaller range of motion than this, such as only a few microns. The greater spacing is achieved in this embodiment because the actuation force is applied (laterally) to the pillar, rather than, for example, by an electrostatic actuator having a first conductive plate mounted on the mirror and a second conductive plate mounted on the substrate. This would typically limit the range of movement of the mirror to be the range of relative movement of the plates such that the electrostatic actuator is able to operate effectively. Typically, this distance is only a few microns. Furthermore, using a comb actuator means that the actuator is efficient even if the moving and fixed parts of the actuator move relatively by an amount roughly equal to the length of the teeth.

Also described herein are methods of forming a micromirror array. A method according to an embodiment comprises providing a plurality of wafers of silicon, forming elements of the micromirror array in the wafers and then bonding the wafers to each other.

Figure 6:
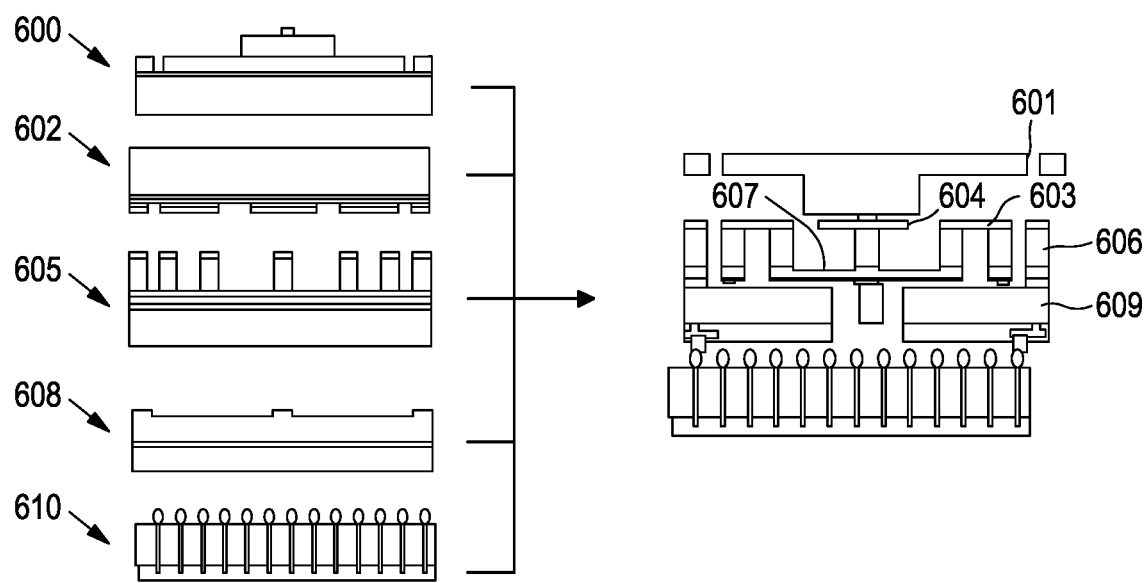
FIG. 6 depicts a method of forming a micromirror array from a plurality of wafers.

FIG. 6 shows a schematic diagram of five silicon wafers that are bonded together to form a micromirror array. The five wafers comprise a wafer 600 for forming the mirror 601, a wafer 602 for forming the upper spring element 603 and optionally for forming the flexible connectors 604 of the heat diffuser, a wafer 605 for forming the combs 606 of the comb actuators and for forming the lower spring element 607, a wafer 608 being an interposer wafer for providing electrical connections to the micromirror array and also for forming a substrate 609 which supports the micromirror array, and a wafer 610 for providing electric connections to the interposer wafer 608.

A method of forming the micromirror array may comprise the following steps:
  a. Providing a first wafer 602 ("upper spring wafer"), which may be a SOI wafer with 1 µm highly doped silicon film. The upper spring 603 pattern is formed in the wafer, and optionally also the flexible connectors 604 of the heat diffuser.
  b. Providing a second wafer 605 ("comb wafer") and forming the combs 606 in the second wafer 605. The comb wafer may comprise two SOI wafers bonded together, one SOI wafer having a thin (e.g. 1 um) highly doped silicon film and the other SOI wafer having a thicker (e.g. 30 um) layer of highly doped silicon. Alternatively the comb wafer 605 may comprise one SOI wafer with a thin (e.g. 1 um) highly doped silicon film and, deposited thereon, a highly doped silicon layer (e.g. 30 um thick). The wafer 605 is patterned to form the combs 606 of the comb actuators.
  c. Bonding the first wafer 600 to the second wafer 605 so as to to connect the upper spring element 603 to the comb actuator. The step of bonding may comprise fusion bonding with cavities. After bonding, a handle wafer of the second wafer 605 can be removed, followed by via patterning, metal fill and patterning or CMP, and lithography and etching to form the lower spring elements 607.
  d. Providing a third wafer 608 ("interposer wafer"), which may be an SOI wafer with a 100 um silicon film. The third wafer 608 is patterned to form cavity holes.
  e. Bonding the third wafer 608 to the first and second wafers 602 and 605 so as to connect the comb actuators to the substrate 609. The step of bonding may comprise fusion bonding with cavities. After bonding, a handle wafer of the third wafer 608 may be removed, followed by via etching through the silicon and oxide of the third wafer 608, oxide liner deposition, then further via etching through silicon and oxide into the second wafer 602, TSV Cu fill and CMP, and redistribution layer (RDL) pattern formation on the non-bonded side of the interposer wafer 608.
  f. Forming connections to the heat sink and sensing elements. The step of forming connections to the heat sink and to the sensing elements may comprise removing a handle wafer of the first wafer 602, followed by via hole patterning and etching though the highly doped silicon film of the first wafer 602, metal fill and patterning, depositing bonding metal and patterning, and removing the oxide membrane on top of the highly doped silicon film of the first wafer 602.
  g. Providing a fourth wafer 600 ("mirror wafer"). The mirror wafer 600 may be an SOI wafer with 250 um silicon film. Providing the mirror wafer 600 may comprise, depositing bonding material and patterning, forming protrusions being capacitor top-plates of the sensing elements, depositing a hard mask and patterning, providing a resist mask and etching silicon (e.g. 100 um etch and over-etch), removing the resist mask and etching the silicon further (e.g. 150 um), and removing the hard mask.
  h. Bonding the mirror wafer 600 to the stack of wafers comprising the first wafer 602, the second wafer 605 and the third wafer 608, so as to form the post connecting the mirror to the substrate 609. The bonding may comprise eutectic bonding.
  i. Forming bump pads on the third wafer 608 and etching to release the post supporting the mirror 601.
  j. Providing a fifth wafer 610 ("electronics wafer"). The step of providing the fifth wafer 610 may comprise providing HV, analog, and digital CMOS components in the electronics wafer, forming TSVs (e.g. 5000 to 10000 connections), and forming bump balls for connecting to the interposer wafer 608.
  k. Attaching the electronics wafer 610 to the interposer wafer 608 using the solder bumps on the respective wafers 608 and 610.
  l. Removing a handle wafer of the mirror wafer 600 to release the mirror 601, followed by dicing (e.g. laser dicing) to complete the micromirror array.

Figure 7:
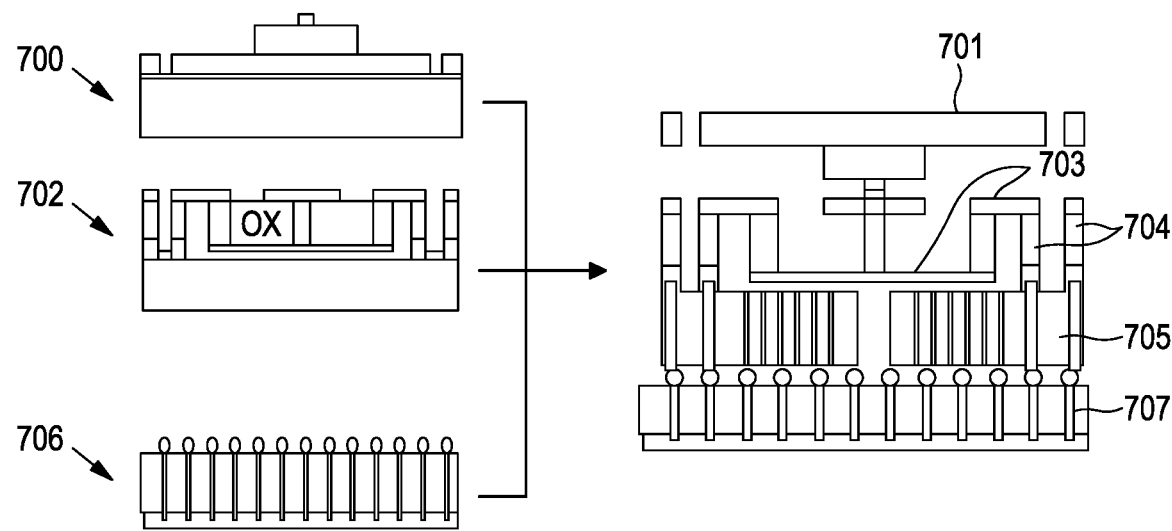
FIG. 7 depicts an alternative method of forming a micromirror array comprising a step of HF vapor etching.

FIG. 7 shows a schematic diagram of an alternative method of forming a micromirror array comprising only three wafers that are bonded together. The three wafers comprise a mirror wafer 700 for forming the mirror 701, a middle wafer 702 for forming spring elements 703, the combs 704 of the comb actuators, and the substrate 705 which supports the micromirror array, and an electronics wafer 706 for providing electric connections 707 to the micromirror array.

The method of forming the micromirror array may comprise the following steps:
  a. Providing a first wafer 702 ("middle wafer"). The step of providing may comprise providing an SOI wafer with a 1 um highly doped silicon film, depositing oxide, etching of anchor trenches, filling trenches with polysilicon followed by CMP, patterning oxide to provide a masking layer for the lower spring element 703, and epitaxially growing a 30 um thick silicon layer on the patterned oxide followed by CMP. The step of providing the middle wafer may further comprise, silicon dry reactive ion etching (DRIE) using the oxide as stopping layer, filling the etched silicon with oxide, epitaxially growing a 1 um silicon layer (poly and single crystalline) for the upper spring elements 703, and etching the silicon layer to form the upper spring elements 703. The step of providing the middle wafer may further comprise flipping the wafer, via etching, isolation layer deposition, filling vias with metal and patterning (e.g. to form 5000 to 10000 connections).

b. Providing a second wafer 700 ("mirror wafer"). The mirror wafer 700 may be an SOI wafer with 250 um silicon film. Providing the mirror wafer 700 may comprise, depositing bonding material and patterning, forming protrusions being capacitor top-plates of the sensing elements, depositing a hard mask and patterning, providing a resist mask and etching silicon (e.g. 100 um etch and over-etch), removing the resist mask and etching the silicon further (e.g. 150 um), and removing the hard mask.

c. Bonding the first and second wafers together. The bonding may comprise eutectic bonding.

d. Releasing the spring elements 703 and the combs 704. The step of releasing may comprise forming bump bonding pads (e.g. 10 to 20 per mirror), etching vias through a handle wafer of the first wafer to form space for the movement of the lower spring elements 703 to form a path for subsequent vapor HF etch, etching oxide using vapor HF etch to release the spring element 703 and the combs 704.

e. Providing a third wafer 706 ("electronics wafer"). The step of providing the electronics wafer 706 may comprise providing HV, analog, and digital CMOS components in the electronics wafer, forming TSVs (e.g. 5000 to 10000 connections), and forming bump balls for connecting to the middle wafer 702.

f. Attaching the electronics wafer 706 to the middle wafer 702 using the solder bumps on the respective wafers.

g. Removing a handle wafer of the mirror wafer 700 to release the mirror 701, followed by dicing (e.g. laser dicing) to complete the micromirror array.

Embodiments are provided according to the following clauses:

1. A micromirror array comprising:
    a substrate;
    a plurality of mirrors for reflecting incident light;
    for each mirror of the plurality of mirrors, a respective post supporting the mirror;
    and
    for each mirror of the plurality of mirrors, one or more electrostatic actuators connected to the substrate for applying force to the post to displace the post relative to the substrate, thereby displacing the mirror.

2. A micromirror array according to clause 1, wherein the one or more electrostatic actuators comprise at least a pair of comb actuators, wherein each comb actuator comprises a static part fixed to the substrate and a moving part which is movable relative to the substrate and connected to the post, at least one plurality of elongate conductive elements extending from the static part and being interleaved with a plurality of elongate conductive elements extending from the moving part.

3. A micromirror array according to clause 2, wherein the one or more electrostatic actuators include two pairs of comb actuators connected to the post and arranged to enable tip and tilt displacement control of the mirror, wherein each comb actuator comprises a static part fixed to the substrate and a moving part which is movable relative to the substrate and connected to the post.

4. A micromirror array according to clause 2 or 3, wherein the moving part of each comb actuator is shaped as a trapezium and anchored to the substrate at some or all corners of the trapezium.

5. A micromirror array according to any one of the preceding clauses, wherein each electrostatic actuator is connected to the post by one or more spring elements.

6. A micromirror array according to any one of the preceding clauses and comprising, for each mirror of the plurality of mirrors, a sensing element for sensing displacement of the mirror.

7. A micromirror array according to clause 6, wherein the sensing element comprises a protrusion from the mirror and an electrode connected to the substrate and arranged to sense a capacitance between the protrusion and the electrode.

8. A micromirror array according to clause 6, wherein the sensing element comprises a piezoresistor coupled to the post.

9. A micromirror array according to any one of the preceding clauses, and comprising, for each mirror of the plurality of mirrors, a heat diffuser for diffusing heat from the mirror to the substrate.

10. A micromirror array according to clause 9, wherein the heat diffuser comprises a heat sink and one or more flexible connectors connecting the heat sink to the post.

11. A micromirror array according to any one of the preceding clauses, wherein each mirror of the plurality of mirrors is for reflecting light having a wavelength of substantially 13.5 nm.

12. A programmable illuminator comprising a micromirror array according to any one of clauses 1 to 11 for conditioning a radiation beam.

13. A programmable illuminator according to clause 12 and comprising a displacement control feedback system configured to determine for each mirror of the plurality of mirrors a position of the mirror and to adjust a voltage applied to the one or more electrostatic actuators based on the determined position and based on a predefined target position of the mirror.

14. A lithographic apparatus arranged to project a pattern from a patterning device onto a substrate, comprising a programmable illuminator according to clauses 12 or 13 for conditioning a radiation beam used to illuminate the patterning device and/or for conditioning a radiation beam used to measure a target structure on the substrate.

15. An inspection apparatus, comprising a programmable illuminator according to clauses 12 or 13 for conditioning a radiation beam used to measure a target structure on a substrate.

16. A method of forming a micromirror array comprising:
    providing a substrate;
    forming a plurality of mirrors for reflecting incident light and, for each mirror of the plurality of mirrors, a respective post supporting the mirror;
    forming, for each mirror of the plurality of mirrors, one or more electrostatic actuators connected to the substrate for applying force to the post to displace the post relative to the substrate, thereby displacing the mirror.

17. A method according to clause 16, wherein the step of forming the one or more electrostatic actuators comprises forming at least a pair of comb actuators, wherein each comb actuator comprises a static part fixed to the substrate and a moving part which is movable relative to the substrate and connected to the post, at least one plurality of elongate conductive elements extending from the static part and being interleaved with a plurality of elongate conductive elements extending from the moving part.

18. A method according to clause 16, wherein the step of forming the one or more electrostatic actuators includes forming two pairs of comb actuators arranged to enable tip and tilt displacement control of the mirror, wherein each comb actuator comprises a static part fixed to the substrate and a moving part which is movable relative to the substrate and connected to the post.

19. A method according to clause 17 or 18, wherein each comb actuator is shaped as a trapezium and anchored to the substrate at some or all corners of the trapezium.

20. A method according to any one of clauses 16 to 19, wherein the step of forming the one or more electrostatic actuators comprises forming one or more spring elements connecting the one or more electrostatic actuators to the post.

21. A method according to any one of clauses 16 to 20 and comprising, for each mirror of the plurality of mirrors, forming a sensing element for sensing a displacement of the mirror.

22. A method according to clause 21, wherein the step of forming the sensing element comprises forming a protrusion from the mirror and an electrode connected to the substrate and arranged to sense a capacitance between the protrusion and the electrode.

23. A method according to clause 21, wherein the step of forming the sensing element comprises forming a piezoresistor coupled to the post.

24. A method according to any one of clauses 16 to 23 and comprising, for each mirror of the plurality of mirrors, forming a heat diffuser for diffusing heat from the mirror to the substrate.

25. A method according to clause 24, wherein the step of forming the heat diffuser comprises forming a heat sink and one or more flexible connectors connecting the heat sink to the post.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A micromirror array comprising:
a substrate;
a plurality of mirrors for reflecting incident radiation;
for each mirror of the plurality of mirrors, a respective post supporting the respective mirror; and
for each mirror of the plurality of mirrors, one or more electrostatic actuators connected to the substrate to apply force to the respective post to displace the respective post relative to the substrate and to displace the respective mirror,
wherein the one or more electrostatic actuators is connected to the respective post by one or more spring elements.

2. The micromirror array according to claim 1, wherein the one or more electrostatic actuators comprise at least a pair of comb actuators, wherein each comb actuator comprises a static part fixed to the substrate, a moving part which is movable relative to the substrate and connected to the respective post, and at least one plurality of elongate conductive elements extending from the static part and being interleaved with a plurality of elongate conductive elements extending from the moving part.

3. The micromirror array according to claim 1, wherein the one or more electrostatic actuators include two pairs of comb actuators connected to the respective post and arranged to enable tip and tilt displacement control of the respective mirror, wherein each comb actuator comprises a static part fixed to the substrate and a moving part which is movable relative to the substrate and connected to the respective post via the one or more spring elements.

4. The micromirror array according to claim 2, wherein the moving part of each comb actuator is shaped as a trapezium and anchored to the substrate at some or all corners of the trapezium.

5. The micromirror array according to claim 1, further comprising, for each mirror of the plurality of mirrors, a sensing element configured to sense displacement of the respective mirror.

6. The micromirror array according to claim 5, wherein the sensing element comprises a protrusion from the respective mirror and an electrode connected to the substrate and arranged to sense a capacitance between the protrusion and the electrode.

7. The micromirror array according to claim 5, wherein the sensing element comprises a piezoresistor coupled to the post.

8. The micromirror array according to claim 1, further comprising, for each mirror of the plurality of mirrors, a heat diffuser configured to diffuse heat from the respective mirror to the substrate.

9. The micromirror array according to claim 8, wherein the heat diffuser comprises a heat sink and one or more flexible connectors connecting the heat sink to the respective post.

10. The micromirror array according to claim 1, wherein each mirror of the plurality of mirrors is configured to reflect radiation having a wavelength of substantially 13.5 nm.

11. A programmable illuminator comprising the micromirror array according to claim 1 for conditioning a radiation beam.

12. The programmable illuminator according to claim 11, further comprising a displacement control feedback system configured to determine for each mirror of the plurality of mirrors a position of the respective mirror and to adjust a voltage applied to the one or more electrostatic actuators based on the determined position and based on a predefined target position of the respective mirror.

13. A lithographic apparatus arranged to project a pattern from a patterning device onto a substrate, the lithographic apparatus comprising the programmable illuminator according to claim 11 for conditioning a radiation beam used to illuminate the patterning device and/or for conditioning a radiation beam used to measure a target structure on the substrate.

14. An inspection apparatus, comprising the programmable illuminator according to claim 11 for conditioning a radiation beam used to measure a target structure on a substrate.

15. A method of forming a micromirror array, the method comprising:
- forming a plurality of mirrors for reflecting incident radiation and, for each mirror of the plurality of mirrors, a respective post supporting the respective mirror;
- forming, for each mirror of the plurality of mirrors, one or more electrostatic actuators connected to a substrate to apply force to the respective post to displace the respective post relative to the substrate and to displace the respective mirror; and
- forming one or more spring elements connecting the one or more electrostatic actuators to the respective post.

16. The method according to claim 15, wherein the forming the one or more electrostatic actuators comprises forming at least a pair of comb actuators, wherein each comb actuator comprises a static part fixed to the substrate, a moving part which is movable relative to the substrate and connected to the respective post via the one or more spring elements, and at least one plurality of elongate conductive elements extending from the static part and being interleaved with a plurality of elongate conductive elements extending from the moving part.

17. The method according to claim 15, wherein the forming the one or more electrostatic actuators includes forming two pairs of comb actuators arranged to enable tip and tilt displacement control of the respective mirror, wherein each comb actuator comprises a static part fixed to the substrate and a moving part which is movable relative to the substrate and connected to the respective post via the one or more spring elements.

18. The method according to claim 16, wherein each comb actuator is shaped as a trapezium and anchored to the substrate at some or all corners of the trapezium.

19. The method according to claim 15, further comprising, for each mirror of the plurality of mirrors, forming a sensing element for sensing a displacement of the mirror.

20. The method according to claim 19, wherein the forming the sensing element comprises forming a protrusion from the respective mirror and forming an electrode connected to the substrate and arranged to sense a capacitance between the protrusion and the electrode.

21. The method according to claim 19, wherein the forming the sensing element comprises forming a piezoresistor coupled to the respective post.

22. The method according to claim 15, further comprising, for each mirror of the plurality of mirrors, forming a heat diffuser for diffusing heat from the respective mirror to the substrate.

23. The method according to claim 22, wherein the forming the heat diffuser comprises forming a heat sink and one or more flexible connectors connecting the heat sink to the respective post.

* * * * *

UNITED STATES PATENT AND TRADEMARK OFFICE
CERTIFICATE OF CORRECTION

PATENT NO. : 12,259,546 B2
APPLICATION NO. : 17/634023
DATED : March 25, 2025
INVENTOR(S) : Alexandre Halbach et al.

It is certified that error appears in the above-identified patent and that said Letters Patent is hereby corrected as shown below:

On the Title Page

Item (71) Applicants:
Please correct "ASML NETHERLANDS B.V., Veldhoven (BE)" to "ASML NETHERLANDS B.V., Veldhoven (NL)"

Signed and Sealed this
Twenty-second Day of April, 2025

Coke Morgan Stewart
*Acting Director of the United States Patent and Trademark Office*